United States Patent [19]

Nolta et al.

[11] 4,420,807

[45] Dec. 13, 1983

[54] SELECTIVELY HOLDING DATA IN A BUFFER FOR DEFECTIVE BACKING STORE TRACKS

[75] Inventors: Arthur H. Nolta; David G. Reed, both of Pima County, Ariz.

[73] Assignee: International Business Machines Corporation, Armonk, N.Y.

[21] Appl. No.: 298,034

[22] Filed: Aug. 31, 1981

[51] Int. Cl.³ .................. G06F 13/00; G06F 11/00; G11C 11/40
[52] U.S. Cl. .................................... 364/200; 365/200
[58] Field of Search ... 364/200 MS File, 900 MS File; 371/10, 11; 365/200

[56] References Cited

U.S. PATENT DOCUMENTS

| | | | |
|---|---|---|---|
| 3,331,058 | 7/1967 | Perkins, Jr. | 364/900 |
| 4,016,547 | 4/1977 | Page | 364/900 |
| 4,028,684 | 6/1977 | Devine et al. | 364/900 |
| 4,051,460 | 9/1977 | Yamada et al. | 364/900 |
| 4,051,461 | 9/1977 | Hoshimoto et al. | 364/900 |
| 4,056,844 | 11/1977 | Izumi | 364/200 |
| 4,078,254 | 3/1978 | Beausoleil et al. | 364/900 |
| 4,149,239 | 4/1979 | Jenkins et al. | 364/200 |
| 4,152,695 | 5/1979 | Democrate et al. | 371/10 |
| 4,310,901 | 1/1982 | Harding et al. | 365/200 |
| 4,346,459 | 11/1982 | Sud et al. | 365/200 |
| 4,376,300 | 3/1983 | Tsang | 365/200 |

OTHER PUBLICATIONS

M. C. Portanova "Program Controlled Lock & Unlock" IBM Technical Disclosure Bulletin, vol. 14 #12, May 1972, p. 3653.

D. K. Chia et al., "Replacement Algorithm Using Priority Class Structure" IBM Tech. Discl. Bulletin, vol. 15 #12, May '73, pp. 3803-3805.

J. W. Irwin "Read-Only" Memory Patch Programming IBM Technical disclosure Bulletin, vol. 14 #8, Jan. 1972, pp. 2325-2327.

*Primary Examiner*—Jerry Smith
*Assistant Examiner*—Mark P. Watson
*Attorney, Agent, or Firm*—H. F. Somermeyer

[57] ABSTRACT

Data associated with a defective area of a backing store and stored in an alternate area, such as defective and alternate tracks in a direct access storage device, is selectively stored in a high speed buffer front store based upon usage of such data. A first replacement control governs buffer operation for data from good areas of the backing store, and a second independent replacement control governs buffer operation for data from alternate storage areas. Limitations are imposed on the amount of data subject to the second replacement control.

22 Claims, 7 Drawing Figures

SELECTIVELY HOLDING DATA IN A BUFFER FOR DEFECTIVE BACKING STORE TRACKS

FIELD OF INVENTION

The present invention relates to external data memories and particularly to bypassing error condition.

DISCUSSION OF THE PRIOR ART

External memories for data processing apparatus have employed retentive memories with nonretentive, or volatile, buffer memories for enhancing access to data stored in the retentive portion of the memory. U.S. Patent Eden U.S. Pat. No. 3,569,938 shows retentive external memories, such as disk storage apparatus (also termed direct access storage devices—DASD), magnetic tape devices and the like having enhanced access through the use of a data buffer interposed between the using data processing apparatus and the retentive memory. In operating such memories, it is desired to make error conditions, such as defective tracks on DASD and defective areas on magnetic tapes used in tape recorders and the like, transparent to the data processing apparatus. A main advantage is to simplify the data processing apparatus' of the external memory by reducing its management requirements.

This transparency is particularly important for accommodating defects in the retentive portion of the external memory.

In DASD it is common practice for each disk recording surface to provide a small plurality of alternate storage tracks. When a storage track which is normally used for storing data becomes defective, a pointer can be recorded on such "defective" track pointing to the alternate track. Upon accessing such defective track, known DASD controls cause the transducer to move radially to the alternate track, all independent of host action. The data is then read from the alternate track or recorded onto the alternate track. While this action is performed independent of the data processing apparatus, the data processing apparatus must still wait until the radial head movement to the alternate track is completed. This delay in access time can impact performance of the data processing apparatus as well as impact the performance of the external memory. Examples of such alternate storage area utilization are shown in the U.S. Pat. Nos. Perkins Jr. 3,331,058 and Yamada et al 4,051,460. Accordingly, it is desired to reduce the performance degradation due to use of alternate tracks in DASD storage apparatus or of alternate storage areas in magnetic tape apparatus.

The efficiency of a buffer interposed between a data processing apparatus and a retentive memory, as shown in the Eden Patent supra, depends in large part on space management of the buffer as well as on the data promotion algorithms and replacement algorithms. Usually, a least-recently used algorithm is provided for replacement control, i.e., when the buffer becomes full of data and more data is to to provided to the buffer, either from the data processing apparatus or from the retentive memory, some of the data in the buffer must be moved to either the data processing apparatus or the retentive memory. For movements of the retentive memory, least-recently used algorithms, of known design, have been widely used. For data that will be used a lot by the data processing apparatus, the data can be locked, or pinned, in the buffer. Such an apparatus is shown in the IBM Technical Disclosure Bulletin article by M. C. Portanova "Program Controlled Lock and Unlock", Vol. 14, No. 12, May, 1972, p. 3653. Further pinning, or locking, in a buffer memory is shown by Hashimoto et al, U.S. Pat. No. 4,051,461. In this patent a permanent error in a main memory is avoided by dedicating a buffer register memory to replace or serve as an alternative area for the defective main memory area. While this solution provides maintenance of the main memory in accommodating defects, the more defects that occur in main memory, the less efficient the buffer main memory combination is as a buffered memory system. Only a limited number of bad defect areas can be accommodated in an efficient manner. Accordingly, a better system of accommodating defects is still needed.

Pinning data into a buffer can reduce efficiencies of the buffered storage system. While a larger buffer can reestablish the buffer efficiency, this is done at increased cost, which may not be justifiable in a particular application. The solution to this problem is to minimize pinning of data in the buffer while still efficiently accommodating defective areas in the retentive portion of the memory. Other terms used to describe apparatus discussed above include a cache as a term for the buffer. The buffer is also termed as a front store, while the retentive memory is termed as a backing store. Other terms include a first level for the retentive memory and a second level for the buffer. Yet other terms have been used for describing such a memory system, whether it be internal to the data processing apparatus or external to the data processing apparatus.

SUMMARY OF THE INVENTION

In accordance with the invention, data associated with a defective area in a backing store is selectively pinned to or held in a buffer based upon usage of the data, such that only that data associated with defective areas which is likely to be used on a relatively long-term basis is pinned in the buffer.

The number of data units pinned or stored for an extended time in the buffer is limited, and a replacement function allows new data to be pinned to the buffer by replacing old pinned data, such that only data likely to be used remains pinned in the buffer. A discard function is provided to selectively remove pinned data from the buffer whenever usage is no longer indicated by the data processing apparatus. Data from a plurality of backing store devices can be simultaneously pinned in the buffer for defective tracks in the various devices.

A method implementing the invention includes accessing desired data from a memory system having a backing and front store by first testing whether or not the front store contains the desired data or has space allocated to the desired data. If the desired data is not in the front store, then the backing store is accessed to fetch the desired data. For recording data, space is allocated in the front store for receiving the data. In accessing the backing store, a defective storage area can be detected where the desired data was thought to be stored. Then, such desired data is accessed from the backing store from an alternate area in the backing store. The alternately stored desired data is then transferred to the front store and pinned in the front store for a predetermined time independent of any managing means which manages space or data content of said front store, such that the desired data is selectively rapidly available from the front store for avoiding accessing the alternate area during the predetermined time.

The above method can be modified by electrically indicating a maximal amount of data pinnable to or held for an extended time said front store due to defective areas in the backing store. An electrical indication is maintained of all of the pinned data together with a storage status indication for each data. Then, before transferring the desired data to the front store, the electrical indications are examined to see if some of the previously pinned data should be replaced to thereby maintain a maximal amount of such pinned data in the front store. In accordance with this modification of the first-mentioned method, a replacement control for data pinned in the front store due to defects in the backing store is provided independent of any other replacement controls.

The foregoing and other objects, features, and advantages of the invention will be apparent from the following more particular description of the preferred embodiments of the invention, as illustrated in the accompanying drawings.

DETAILED DESCRIPTION

Figure 1:
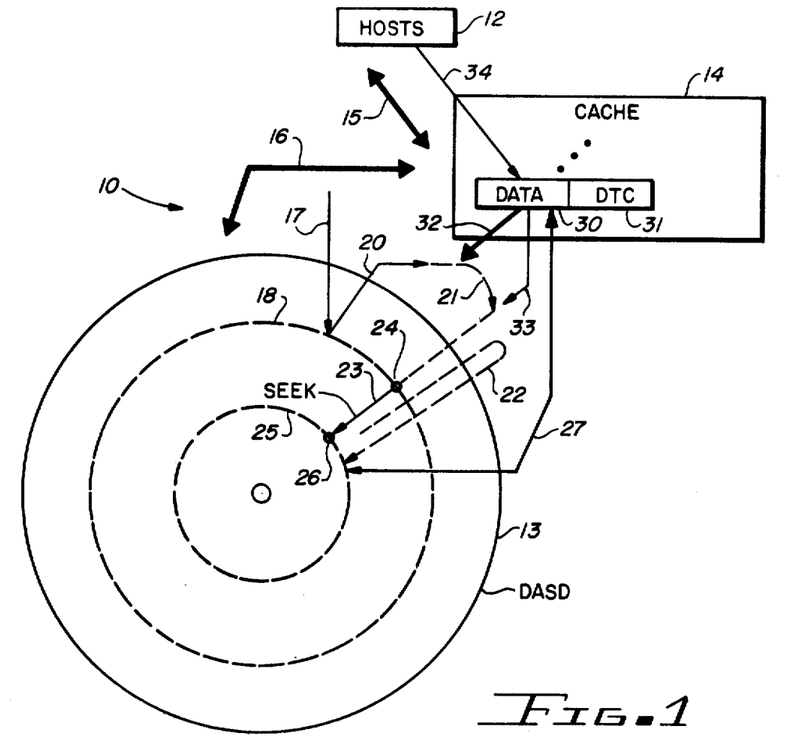
FIG. 1 is a diagrammatic showing of practicing the invention in an external memory having a volatile cache and a retentive DASD backing store.

Referring now more particularly to the drawings, like numerals indicate like parts and structural features in the various diagrams. FIG. 1 illustrates a two-level data memory system 10 connected to one or more hosts 12. The hosts 12 are various forms of data processing apparatus. The backing store portion of system 10 includes a plurality of DASD 13 which provide data to hosts 12 and receive data from hosts 12 via a cache 14. Cache 14 is preferably a high-speed, random-access memory of the semiconductor type, no limitation thereto intended. Generally, hosts 12 access data from and store data into system 10 throuh cache 14 as indicated by a double-headed arrow 15, i.e., all attempted accesses to system 10 examine cache 14 first to determine if the data is in the cache or if the cache has space allocated for data to be stored. For data being stored into system 10 (updating data) when there is no space already allocated in cache 14, the system automatically allocates some space in cache 14 and receives the data from one of the hosts 12. For data being fetched and not resident in cache 14, data is staged, i.e., moved from DASD 13 to cahce 14, as indicated by double-headed arrow 16. When cache 14 becomes too full of data, a replacement control based upon a least-recently-used algorithm destages data, i.e., moves data from cache 14 to DASD 13 for freeing space in cache 14 to receive data from one or more of the hosts 12 or from DASD 13.

In preparing for staging or destaging operations, a seek to the appropriate storage area in DASD 13 may be required. Such an attempted access is indicated by arrow 17 pointing to track 18, which is a target track supposedly containing data to be fetched for cache 14 or to receive data being destaged from cache 14. As a result of attempted access 17, system 10 control (not shown), processing the home address, determines that track 18 is a faulty or defective track. This action is achieved using known techniques of recording indicia in record track 18 in an area that is not defective (a defective track only includes a certain percentage of defects in the track) which identifies the track 18 as being defective and includes an address pointing to an alternate track, such as track 25. System 10 then accesses the alternate track as indicated by arrow 21 by moving a transducer 24 as indicated by arrow 23, a seek operation, from track 18 to track 25 as indicated by circle 26. The transducer 24 having reached track 25, system 10 accesses alternate track 25 as indicated by arrow 22. All alternate tracks are known to be good tracks. The data transfer between cache 14 and DASD 13 occurs as indicated by double-headed arrow 27. In connection with the data transfer indicated by arrow 27, data is pinned in the cache or was pinned in cache to accommodate the defective track 18 for omitting seek 23 to the alternate tracks for attempted accesses to the data area by hosts 12. Data is stored in cache 14 as indicated by area 30. Such data is pinned to cache 14 as indicated by defective track control DTC 31, which is further described with respect to FIG. 3. DTC 31 prevents data 30 from being destaged to DASD 13 until appropriate conditions, as later described, are met. In this manner the data at 30 is pinned to cache 14 for a predetermined time as indicated by those criteria.

Included in DTC 31 is an independent so-called pinned replacement control indicated by arrow 32. In other words, the arrow 32 control replaces the pinned data 30 independently of the replacement control associated with the staging and destaging of data indicated by double-headed arrow 16. In other words, there are two classes of data in cache 14; regular, or normal, data which is replaced in accordance with a least-recently-used algorithm indicated by double-headed arrow 16, and a second and independent replacement control for pinned data only as represented by arrow 32. When pinned data 30 needs to be replaced, the replacement control indicated by arrow 32 first occurs, then data is transferred to cache 14 as indicated by double-headed arrow 27. In a simple embodiment of the independent replacement control replacing the oldest pinned data first, the pinned data 30 was limited to a predetermined number of storage areas in cache 14. So long as that predetermined number was not exceeded, no replacement control was effective. The predetermined number of storage areas was not limited to any address portion of cache 14, i.e., any register of cache 14 could be used. In this manner, that portion of the address base allocable to the pinned data 30 can be used for storing normal data, thereby maximizing efficiency of cache 14.

A further control is provided by hosts 12 indicating to system 10 that the pinned data 30 need no longer reside in cache 14. Such a control is termed a discard command. At that time system 10 examines the data 30 to be discarded. If the data to be discarded was modified, that data is destaged directly to alternate track 25 of DASD 13 as indicated by arrow 33, and the space it occupied in cache 14 is freed for other use by either normal data or pinned data. If the data to be discarded is not modified from that stored in DASD 13 alternate track 25, the data is merely effectively erased by deleting a directory entry pointing to that data, as will be later described. In accordance with all of the above, it is noted that, when hosts 12 want to write data into system 10, all of the writing goes to cache 14 whether or not there is memory space already allocated to cache 14 and independent of whether or not the data stored in such allocated space is pinned due to a defective track. System 10 has its own internal procedures for handling such written data after it is received from a host 12. Selective cache 14 bypassing can be optionally provided.

Figure 2:
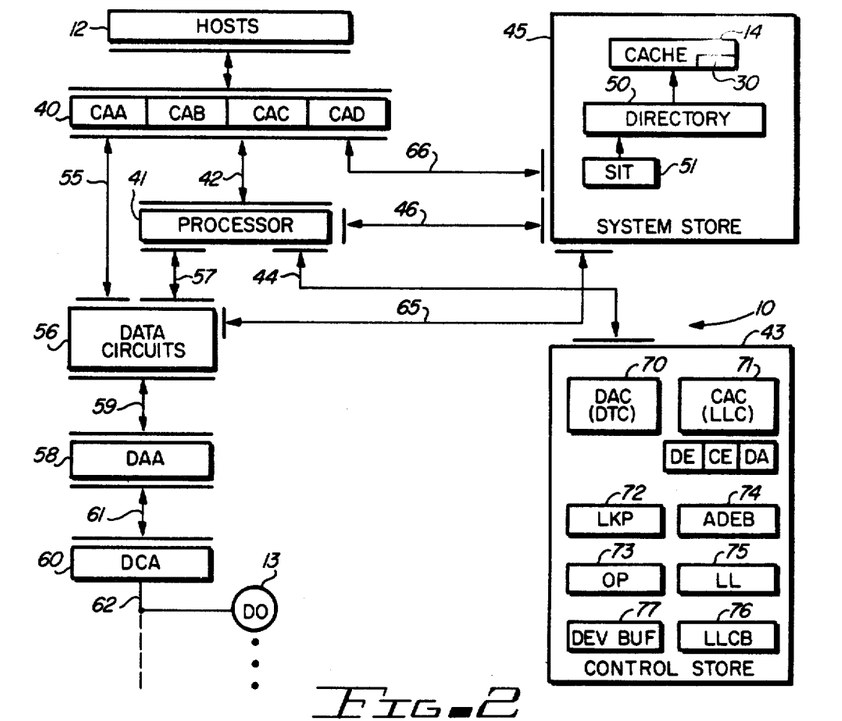
FIG. 2 is a block diagram related to the FIG. 1 illustration.

FIG. 2 illustrates a practical embodiment of the FIG. 1 illustrated system 10. A plurality of the hosts 12 are connected to system 10 via a plurality of so-called channel adaptors 40. Channel adaptors 40 provide the usual input/output or peripheral connections to hosts 12. A programmed digital processor 41, such as a microprocessor, operates system 10 using known programming techniques. Processor 41 communicates with channel adaptors 40 via bidirectional bus 42. Processor 41 monitors the activity of the channel adaptors 40 for implementing communication with hosts 12 using known techniques. For containing control programs and control data for operating system 10, processor 41 has a control store 43 which is independently accessible by processor 41 through bidirectional bus 44. Control store 43 is preferably a high-speed, random-access, semiconductor type memory. In addition to control store 43, system 10 includes a so-called system store 45. System store 45 has a large portion thereof allocated to act as cache 14. In addition, a directory 50, pointing to data stored in cache 14, resides in system store 45. Directory 50 is constructed as explained later with respect to FIG. 3. In general, it contains the address of the backing store, or DASD 13, from which the data was fetched or is to be stored, together with the address of cache 14 which stores the data and other control data necessary to the successful operation of system 10. Since cache 14 is relatively large, i.e., several megabytes of data, a hashing algorithm (not shown) for accessing cache 14 is provided. Accordingly, a scatter index table, SIT 51, is also stored in system store 45. SIT 51 contains pointers to entries of directory 50 within a predetermined hash class; that is hosts 12 access the data in system 10 by addressing DASD 13. DASD addresses are manipulated by a so-called hash mechanism (not shown) of any usual design, which identifies classes of addresses, also termed hash classes. SIT 51 has one entry for each of the hash, or address, classes. The entry in SIT 51 contains the address of directory 50 containing a first entry of the directory relating to the hash class. All of the entries in directory 50 within a given hash class are linked together by a singly-linked list.

Direct access to DASD 13 by hosts 12 effects a cache 14 bypass. Such direct access proceeds through a channel adaptor 40, (also denominated individually as CAA, CAB, CAC, and CAD), bidirectional bus 55, data circuits 56, bidirectional bus 59, device adaptor DAA 58, peripheral connection 61, device control adaptor DCA 60, and thence over bidirectional bus 62 to DASD 13. DASD 13 is addressed as devices D0 through D7, only D0 being shown. Processor 41 monitors the operation of this data flow to allow host 12 to communicate directly with DASD 13, with the operation and control within system 10 being that of the usual DASD external memory systems.

Access to cache 14 from a channel adaptor 40 is via bidirectional bus 66, preferably independent of all other data transfers within system 10. Processor 41 controls system store 45 through bidirectional bus 46 in the normal manner of a processor controlling a random access memory. Bidirectional bus 65 extends between system storage 45 and data circuits 56. In a lower cost embodiment, buses 66 and 65 can be combined with channel adaptor 40, switching a single bus between communicating with hosts 12 or with data circuits 56. Movement of data between DASD 13 and system store 45 can use usual stage and destage algorithms, which are not pertinent to an understanding of the present invention.

The control provided by processor 41 for a system 10 operation resides in programs stored in control store 43. Several programs are provided. DAC or direct access control program 70 enables processor 41 to control data circuits 56 when data is being transferred directly between hosts 12 and DASD 13. This type of transfer is referred to as a cache bypass transfer, as commonly used in bypassing a cache between a processor and main memory in the data processing art. The result of this operation compares favorably to a nonbuffered DASD memory system of known design. A portion of DAC 70 is expanded at it relates to defective track control. Such expanded explanation is indicated in FIG. 2 by DTC. The CAC 71 program enables processor 41 to have a cache control for accessing cache 14 for purposes of transferring data between hosts 12 and cache 14 or between DASD 13 and cache 14. CAC 71 also controls directory 50 and SIT 51 and provides for the hashing functions mentioned earlier. The CAC 71 programs include a portion LLC for a link list control for controlling the storage of pinned data 30 within cache 14.

DAC 70 operates with hosts 12 using the well-known chained channel command words (CCWs), i.e., a plurality of peripheral commands are chained together for successive transfers to system 10 to provide a tightly knit sequence of operations between hosts 12 and DASD 13. In operating system 10, CAC 71 provides internal command words (not shown), corresponding to CCWs, which are the equivalent of peripheral commands and which permits CAC 71 to command DAC 70 to provide access to DASD 13 in the same manner that hosts 12 access DASD 13. In this manner DAC 70 is used not only for hosts 12 but also for staging and destaging data with respect to cache 14. Communications between DAC 70 and CAC 71 are provided through link port LKP 72 within control store 43. LKP 72 is merely a message area constructed in accordance with known interprogram communication techaniques. Since operation of system 10 is quite complex, other programs OP 73 are provided for preforming functions not mentioned.

ADEB 74 is a buffer in control store 43 for containing one or more entries of directory 50 for rapid access by processor 41. Since directory 50 is in system store 45, it is advantageous to system 10 efficiency to have a copy of the directory entries of immediate interest stored in control store 43. A DEB 74 active device entry buffer provides that facility. LL 75 contains a link list identifying all pinned data 30. LLCB 76 is a control block used to control LL 75 as later explained with respect to FIG. 3.

Figure 3:
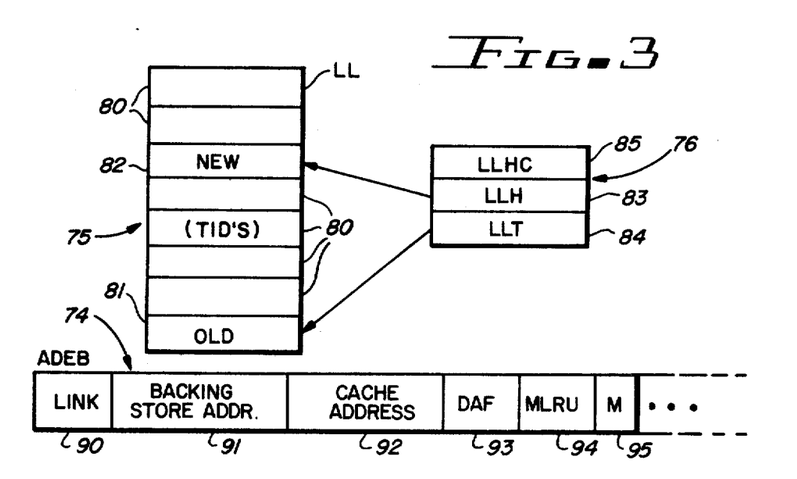
FIG. 3 illustrates certain control registers used in connection with the FIG. 1 illustrated system.

Referring next to FIG. 3, A DEB 74, which represents a single entry of directory 50, is used to describe directoy 50 construction as well as the contents of ADEB 74. Link field 90 points to all entries of directory 50 within the same hash class. A first of the entries will be pointed to by signals in SIT 51. Area 91 contains the backing store address of DASD 13 which relates to the cache address in area 92. DAF 93 is a defective address flag indicating that the data in cache 14 at the cache address in 92 is pinned to cache 14 because of a defective track in DASD 13. The later-described LL 75 identifies the status of the pinned data 30. MLRU 94 is a doubly-linked list extending from the least recently used to the most recently used storage areas of cache 14. MLRU 94 controls the replacement algorithm using normal techniques. MLRU 94 has no relationship to the unpinning of data 30. M bit 95 indicates whether or not the data stored in cache 14 has been modified by hosts 12; that is, if M is zero, then the contents of cache 14, insofar as the data stored at the respective addresses 91, 92 is concerned, are exact replications. Other entries for controlling operation of system 10 can be employed within each of the entries of directory 50.

Figure 4:
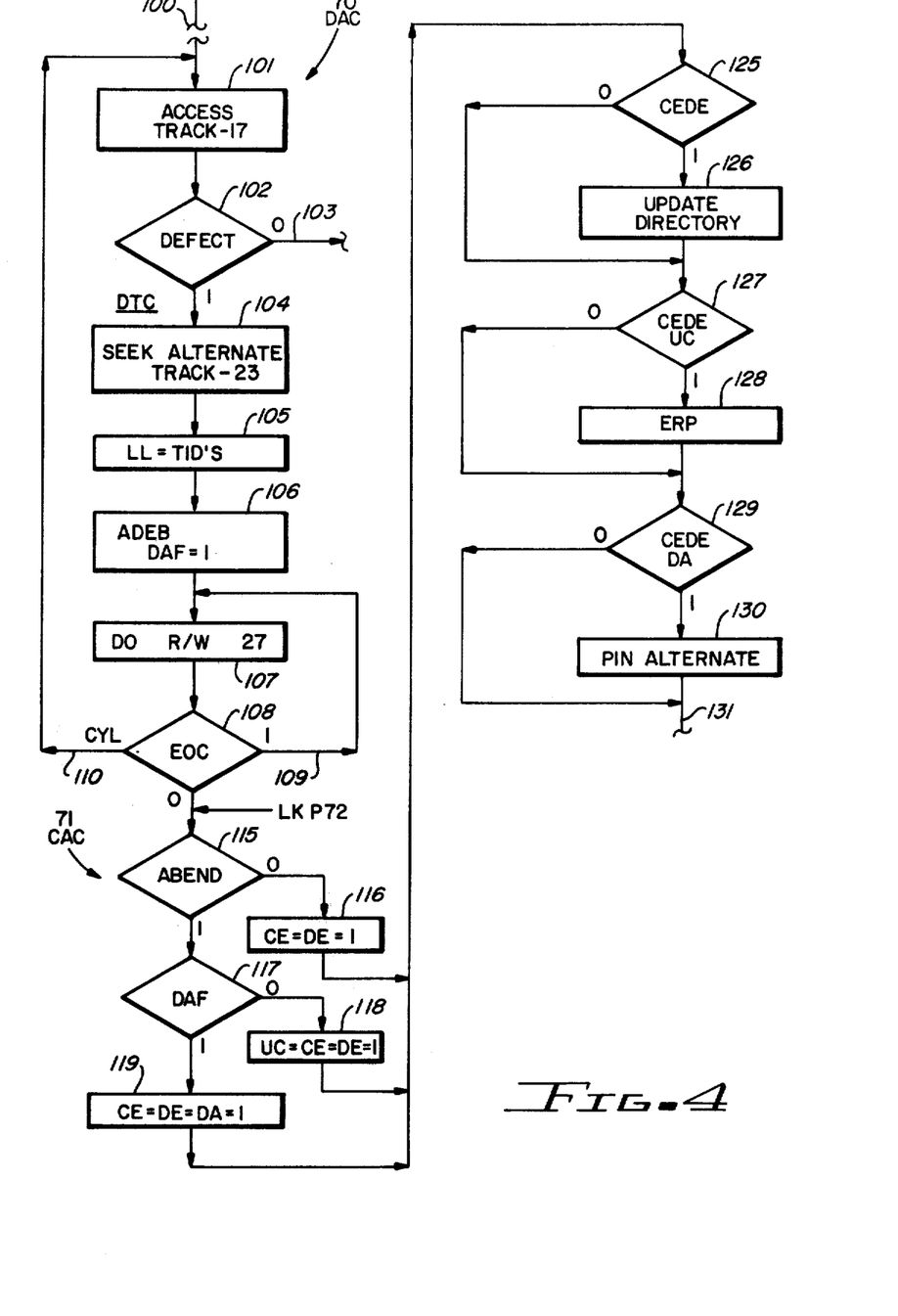
FIG. 4 is a machine operations chart illustrating pinning data in a front store due to defects in the backing store as generally set forth in FIG. 1.

LL 75 is a logical push-down stack having a predetermined number of entry locations 80. The oldest pinned data 30 is identified in slot 81, i.e., slot 81 identifies the data that has been pinned in cache 14 the longest. Slot 82 contains signals identifying the last-received cache 14 pinned data 30. Each of the slots 80 contains a cache address which is linkable to a corresponding directory 50 entry using known techniques. LLCB 76 contains an LL tail indicator 84 and LLH entry indicator 83. LLT 84 points to the oldest pinned data 30, while LLH 83 points to the newest pinned data 30. LLHC 85 is a count of the number of areas of cache 14 having pinned data 30. In the present illustration, six slots have pinned data 30, with a maximum permitted of eight slots: that is, eight storage areas of cache 14 out of a possible 500, for example, may contain pinned data. LL 75 is operated as a FIFO stack (first in, first out) in a usual normal manner. Details of such control are dispensed with for purposes of brevity. FIG. 4 is a machine operations chart showing the DTC portion of DAC 70. It is assumed that processor 41 has a dispatcher or an idle scan loop, and that CAC 71 has determined the data is not in cache 14 or that data written to cache 14 is to be destaged to DASD 13. In any event, certain nonpertinent preliminary machine operations 100 are performed by DAC 70. Included in this processing is the receipt of command words from CAC 71 via LKP 72. At 101, processor 41 commands DASD 13 to access track 18 as indicated by numeral 17 of FIG. 1. After the attempted access of track 18 (FIG. 1), processor 41 at 102 determines whether or not track 18 is a defective track. If not, normal processing for accessing data areas of DASD 13 is followed at 103 and not further described since normal procedures are employed. If a defective track is found, then at 104 processor 41 commands DASD 13 to seek (move transducer 24) to alternate track 25 as represented by arrow 23. While the seek is occurring, i.e., the transducer (not shown) represented by circle 24 is actually moving from track 18 to track 25, processor 41 updates LL 75. Both tracks 18 and 15 identifications (TID) are loaded into LL 75, and LLCB 76 is updated. Slot 82 receives the new TIDs, i.e., the defective track identification and the alternate track identification. LLH 83 is updated to reflect a pointer to slot 82. LLHC is incremented by unity. ADEB 74 is accessed at 106 to set DAF 93 to unity. Upon completion of the seek and of steps 105 and 106, the actual read or write operation is performed at 107. This operation corresponds to double-headed arrow 27. At 108 processor 41 determines whether or not it is the end of the internal chain of commands, i.e., a chain of internal peripheral commands received from CAC 71. If not, logic path 109 is followed to repeat the read/write operation 107 such that a series of blocks of data can be transferred in rapid succession. If the end of a cylinder is reached, i.e., each cylinder has a plurality of tracks in each DASD 13 which are electronically switched while an adjacent cylinder needs a radial head movement, an option of control at 108 is that logic path 110 will be followed to repeat steps 101, etc. In this instance from the alternate track, a seek will be made to a track (not shown) adjacent to defective track 18. That is, after the last record is processed for the alternate track and track index is deleted, a head seek back to the cylinder containing the defective track is effected. Then the next track in the cylinder is accessed. If there are two adjacent defective tracks, then steps 104 through 106 are repeated; otherwise, normal processing 103 is performed.

Upon completion of the chain of commands at 108, CAC 71 is returned to via LKP 72. At 115 processor 41 checks to see whether or not there was an abnormal end (ABEND). If not, the normal channel end (CE) and device end (DE) signals are set to unity at 116 for forwarding to CAC 71. If there was an abnormal end, then at 117 processor 41 checks DAF 93 of ADEB 74. If it is a zero, i.e., there were no abnormalities, i.e. no defective track indicated, an error has occurred. Accordingly, at 118 unit check (UC) indicating CHANNEL END and DEVICE END (CE, DE) are set to unity for reporting to CAC 71.

For DAF 93 equal to unity at 119, processor 41 sets channel end and device end and defective area (DA) flags equal to one, i.e., not only are channel end and device end supplied to CAC 71, but an ending status indicating that a defective track was encountered is also supplied. Then, at 125 the processor 41 through CAC 71 checks to see if step 116 was performed. If so, directory 50 is updated at 126 to reflect the just completed data transfer. Otherwise, at 127 processor 41 checks to see if step 118 was performed. If so, error recovery procedures ERP are invoked at 128, which are beyond the scope of the present description. Otherwise, at 129 processor 41 checks to see if step 119 was executed. If so, the alternate track is pinned at 130 by making DAF 93 of directory 50 equal to unity and verifies that LL 75 and LLCB 76 were updated at steps 105 and 106. At 131 processor 41 continues to additional processing not pertinent to an understanding of the present invention.

Figure 5:
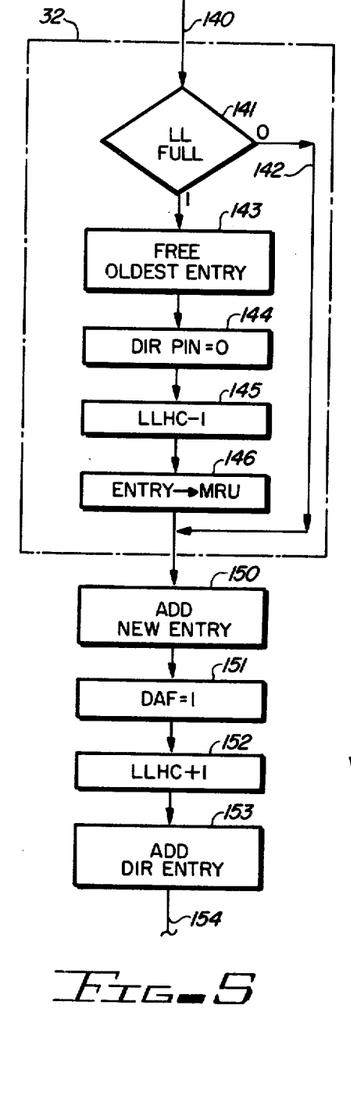
FIG. 5 is a machine operations chart showing a threshold control for limiting the pinned data in a front store to a maximal amount for use with the FIG. 1 illustrated system.

FIG. 5 illustrates step 130 in detail. Entry is at 140. At 141, processor 41 first checks to see if LL 75 is full. This action corresponds to step 32 of FIG. 1. If LL 75 is not full at 141, then logic path 142 is followed to update directory 50, i.e., no pinned replacement activity is required. If LL 75 is full, a replacement action is performed in steps 143 through 146. At 143 the oldest entry in slot 81 (FIG. 3) is identified and will be freed. If the M bit 95 is equal to one, the pinned data is moved to DASD 13 at the appropriate address; then the cache area is freed for new data. Note that this requires a seek from track 25 to a track to be addressed by the data being replaced. Since all alternate tracks are in the same area of each DASD, this can be a short seek. Since data from the alternate track has already been transferred to cache 14, this means that the newly pinned data 30 is not available, i.e., not addressable, until completion of the additional activity instituted through steps 143. At 144 the DAF flag of the oldest entry being freed is reset to zero. LLHC 85 of LLCB 76 is decremented by unity at 145. At 146 the directory 50 entry corresponding to the oldest pinned data 30 is made most recently used. In this regard, the actual data transfer of the oldest entry proceeds simultaneously with the control activities in steps 143-146.

Figure 6:
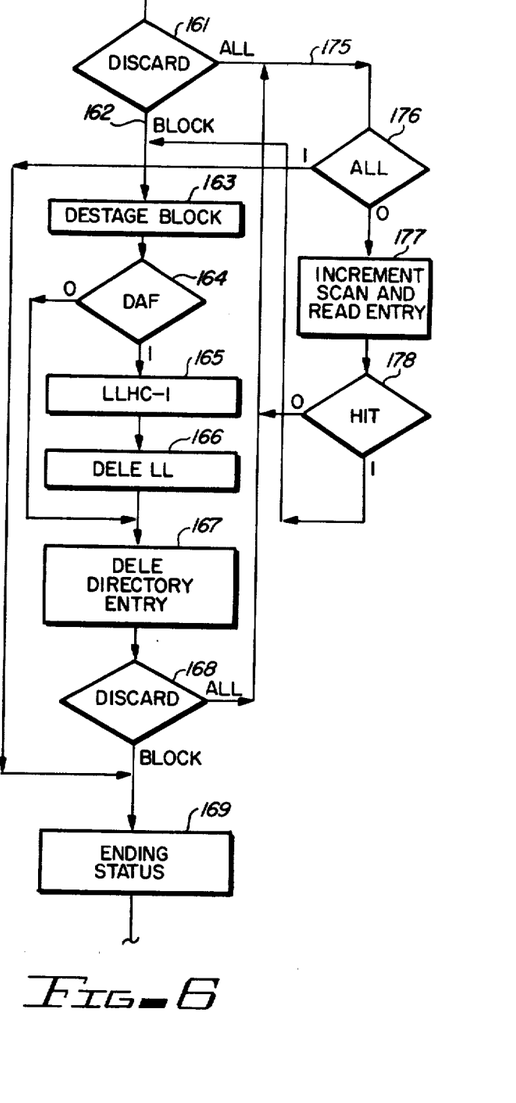
FIG. 6 is a machine operations chart illustrating discarding pinned data from a front store in accordance with a plurality of criteria as used for the FIG. 1 illustrated system.
Figure 7:
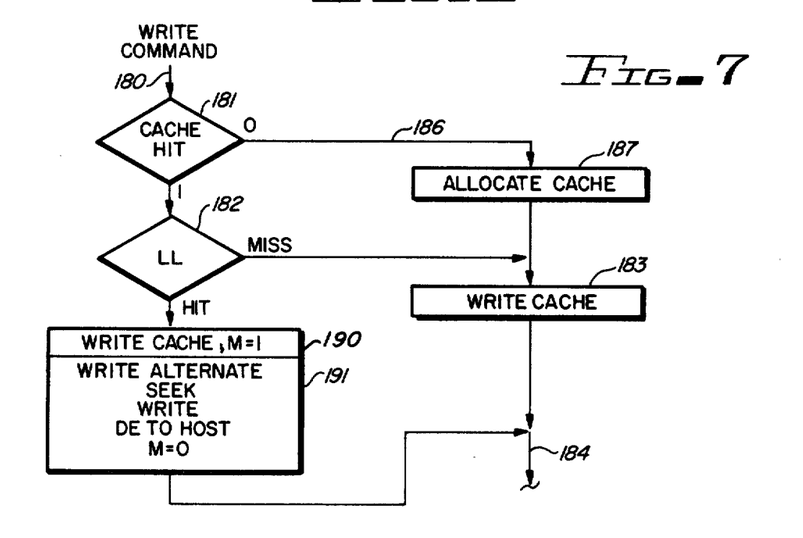
FIG. 7 is a machine operations chart related to operations of the FIG. 1 illustrated system when data is received by the system for a defective area in the backing store.

Then, at 150 the new entry to directory 50 corresponding to the newly pinned data is added using normal data processing techniques. If the DAF flag 93 for this new entry is set to unity at 151, at 152 contents of LLHC 85 are incremented by unity. In the event that steps 143 to 146 were performed, this restores LL 75 full indicator. The LL full indicator is merely a comparison of the contents of LLHC 85 with a threshold value. At 153 the actual directory 50 entry is updated and moved from ADEB 74 to system store 45. Processing by processor 41 continues at 154. FIG. 6 illustrates the discard function of the present invention. The discard function requires a peripheral command from a host 12 indicating that some data is to be discarded from cache 14. At 161 processor 41 examines the peripheral command to determine whether just one block of data is to be discarded or all data with respect to a given DASD 13 is to be discarded. Assume that a single block is to be discarded. If the M bit 95 is one, that block is destaged at 163. If the M bit 95 is zero, no data is transferred to DASD 13; the directory 50 entry is erased to make the data not addressable. Contents of ADEB 74 corresponding to the address block are examined with respect to DAF 93. If the block being discarded was not associated with a defective address in the backing store, then steps 165 and 166 are omitted. If the data being destaged is associated with a defective DASD track, then at 165 contents of LLHC 85 are decremented by one and the corresponding LL 75 entry is deleted at 166 (DELE LL). Since the block being discarded may have been received at any time, LL 75 is scanned so that the cache address corresponding to the backing store is examined to identify the cache address. Once the entry is deleted, of course, a link list of LL 75 (not shown) will be closed in the usual manner. AT 167 (DELE DIRECTORY ENTRY), the directory 50 entry is deleted, and the hash class link list is closed in the normal manner. At 168 processor 41 examines the received peripheral command for a discard block or a discard all command. For a discard block, command ending status is recorded at 169. Then processor 41 continues processing. For a discard all command, processor 41 goes to path 175 which is also entered from step 161, to scan directory 50 as set forth in steps 176 through 178. At 176 processor 41 determines whether or not the scan is completed. Of course, in the first entry this always results in step 177 being performed. Step 177 increments the scan, i.e., increments the directory 50 address such that the next entry is brought into ADEB 74. Then at 178 processor 41 examines the fetched entry to determine whether or not that entry relates to the addressed DASD 13. If so, a block is destaged as described with respect to steps 163 through 168. If the entry does not relate to the addressed DASD 13, logic path 175 is again followed, repeating steps 176 through 178 until all of the appropriate directory 50 entries have been scanned. Referring next to FIG. 7, the machine operations relating to receiving data from hosts 12 are described. A write command is received from a host 12 and examined beginning at 180. The address of DASD 13 to receive the data to be transferred is hashed to access directory 50 to see if space has been allocated in cache 14 for the particular address. Assuming a hit at 181 i.e., space is allocated in cache 14, then at 182 processor 41 examines LL 75 for an entry. In most instances there will not be an entry. Therefore, following the miss route, the host 12 writes to cache 14 at 183, as represented by arrow 34 in FIG. 1 and bus 66 of FIG. 2. Then at 184 processing continues in a usual manner. For a miss at 181, i.e., there is no space allocated in cache 14 for the data to be received, processor 41 follows logic path 186 to allocate space in cache 14 at 187. Then the normal write to cache occurs at 183. For a defective track situation, i.e., data is from an alternate track, step 190 is performed. The data is written to cache at the pinned address. In a first embodiment of the invention, only the M bit of ADEB74 was set to unity with no destaging of the pinned data to DASD 13 until a pinned replacement action occurs, as represented by arrow 32 and as described with respect to FIG. 5. Under this situation, the volatile cache will contain the pinned data which is different from the nonvolatile, or retentive, DASD 13. Loss of power, of course, then loses the modified data. In a second embodiment, step 191 can be performed such that the DASD 13 is updated to reflect the modifications provided to cache 14 by hosts 12. This constitutes destaging the data from the pinned area to DASD 13. This action includes seeking to the alternate track 25, writing the data to alternate track 25 from pinned data area 30, sending a device end (DE) to the host 12 and resetting the M bit 95 to zero, which then indicates an exact replication of data resides in cache 14 and DASD 13. In yet another embodiment, the hosts 12 can indicate critical data such that the critical data will be destaged to alternate track 25 by step 191 while the noncritical data is maintained in the cache 14, subject to the usual pinned replacement control. Of course, power off destroys all data in cache 14. Therefore, each time power to cache 14 is turned off and power is again turned on, there is no pinned data in cache 4. This means that a maximal predetermined time for pinning data is during power on.

While the invention has been particularly shown and described with reference to preferred embodiments thereof, it will be understood by those skilled in the art that various changes in form and details may be made therein without departing from the spirit and scope of the invention.

What is claimed is:

1. The machine-implemented method of operating a data memory hirarchical system having a buffer memory and a backing store having a plurality of possibly defective data storage areas with data intended to be stored in such defective areas stored in alternate areas of said backing store; means for selectively storing portions of said data stored in said backing store in said buffer memory; replacement means for managing data occupancy of data storage space in said buffer memory including removing data from said buffer memory; means for accessing the buffer memory and backing store for effecting data transfers therewith and therebetween; means for indicating a defective data storage area in said backing store;

the machine-executed steps of:

accessing desired data from said memory hierarchy system by first testing said buffer memory, if said desired data is in said buffer memory reading the desired data therefrom; and if said desired data is not in said buffer memory, accessing the desired data from said backing store;

in accessing said backing store, detecting a defective storage area wherein said desired data was to be stored, then, determining which alternate area of said backing store is storing said desired data and accessing the desired data from the determined alternate area; and transferring said accessed desired data to said buffer memory and storing said accessed desired data in said buffer memory for a predetermined time independent of said replacement means such that said accessed desired data is not removed from said buffer memory by said replacement means but held in said buffer memory for avoiding accessing said determined alternate area during said predetermined time.

2. The method set forth in claim 1 further including the machine-executed steps of:

electrically indicating a maximal amount of data holdable in said buffer memory due to said defective areas of said backing store and not removable from the buffer memory by said replacement means;

maintaining electrical indications respectively identifying said holdable data by the defective data storage area of said backing store, which is the respective data storage area intended to store such holdable data together with a storage status indication for data from the respective alternative areas for indicating least recent usage of such data from the respective alternate areas; and before transferring said accessed desired data to said buffer memory, examining said electrical indications; if said electrical indications show less than said maximal holdable data, do said transfer; if said maximal amount is shown, examining said storage status electrical indications and in accordance with said least recent usage indication transferring holdable data that is least recently used to its respective alternate area to enable said transfer of said accessed desired data from its said alternate area to the data storage space currently occupied by said leastrecently used data, said alternate areas having like data storage capacities.

3. The method set forth in claims 1 or 2 further including the machine-executed step of:

receiving an externally-supplied electrical indication that certain portions of said pinned data are not needed; then transferring said certain data portions to respective ones of said alternate areas and which enables the buffer memory space occupied thereby to store other data.

4. The method set forth in claim 1 further including the machine-executed steps of:

for all of said holdable data stored in said buffer memory, establishing a replacement control independent of said replacement means such that said accessed desired data replaces predetermined holdable data stored in said buffer memory rather than replacing data stored in said buffer memory removable by said replacement means.

5. The method set forth in claim 1 or 4 further including the machine-executed steps of:

independently establishing that certain portions of said holdable data stored in said buffer memory are to be removed from said buffer memory; and transferring said certain portions of holdable data to respective alternate areas of said backing store and freeing said buffer memory space occupied by said removed holdable data for storing other data, whether holdable or not.

6. The method set forth in claim 1 wherein said backing store has retentive memory properties and said buffer memory has volatile memory properties;

further including the the machine-executed step of:

keeping said holdable data in said buffer memory from time of storage until said buffer memory has electrical power removed therefrom such that said predetermined time is maximal for each portion of said holdable data.

7. The method set forth in claim 1 or 6, further including the machine-executed steps of:

receiving a signal from an external source signifying that certain portions of said holdable data may be discarded from said buffer memory;

transferring said certain portions of the holdable data to respective ones of said alternate areas in said backing store; and freeing the space in the buffer memory occupied by said certain data for storing other data.

8. The method set forth in claim 1 or 6, further including the machine-executed steps of limiting the memory space in said buffer store for said alternate areas of said backing store to a predetermined size and determining said predetermined time by an analysis of the number of defective areas referenced and said predetermined size.

9. The machine-implemented method of operating a peripheral system having a retentive data storage apparatus with a plurality of addressable storage segments and a volatile data memory coupled to said storage apparatus for storing selected portions of data stored in said storage apparatus in memory slots in said data memory, each slot having a data storage capacity equal to the data storage capacity of a one of said storage segments;

the machine-implemented steps of:

detecting an error condition in predetermined ones of said storage segments and retentively recording a pointer signal in each one of said predetermined ones of said storage segments identifying an alternate one of said storage segments to receive data signals intended for said predetermined ones of said storage segments; respectively;

attempting to access data intended to be stored in a one of said predetermined ones of said storage segments, reading said pointer signal and then transferring a copy of said data retentively stored in said alternate storage segment to a given one of said memory slots in said data memory and retaining said data in said data memory so long as power is supplied thereto; and building a directory in said data memory indicating said data from each of said alternate data segments with an address of said one of said predetermined ones of said storage segments pointing to said given memory slot such that a subsequent attempted access to data intended to be stored in said one of said predetermined ones of said storage segments is accessed from said given memory slot.

10. The method set forth in claim 9, further including monitoring the number of and keeping a FIFO list in said directory of said memory slots containing data from said alternate data segments; and establishing a predetermined number;

when the monitored number equals said predetermined number, examining said FIFO list and then removing data from said memory slot identified in said FIFO list as a first memory slot to receive data from a one of said alternate storage segments.

11. The method set forth in claim 9 or 10, including receiving from a peripheral system user a command to discard predetermined data from said data memory;

examining said directory to determine whether said predetermined data is from any of said alternate storage segments;

upon determining that said predetermined data is from a given one of said any alternate storage segments, storing said predetermined data in said given one of said alternate storage segments; and deleting identification of said predetermined data and said given one of said alternate storage segments from said directory.

12. The method of writing data to a peripheral memory having a retentive backing store and nonretentive front store, a directory indicating data stored in the front store, an alternate directory indicating data stored in the front store from alternate areas of said backing store wherein said alternate areas of said backing store stored data intended to be stored in portions of said backing store, which are sufficiently degraded as to not permit complete data storage;

the machine-implemented steps of:

examining the first-mentioned directory to determine whether or not space has been allocated in said front store, if space has not been allocated in said front store, allocating space in said front store and writing the data to the front store;

when said first-mentioned directory indicates that space has been allocated in said front store for data to be written, examining said alternate directory, if said alternate directory indicates the data to be written is not identifiable with an alternate area of said backing store having data store in said front store by having no entry for such data to be written, writing the data to be written to said front store in the space indicated as being allocated therefor by the first directory; and when said alternate directory indicates that the allocated space of said front store is associated with a predetermined alternate area of said backing store, writing the data to be written to said front store and indicating that the data is different than the data in said predetermined alternate area of said backing store and writing the data to said predetermined alternate area of said backing store and resetting said indicator of said first-mentioned directory such that the data stored in said front store corresponding to said predetermined alternate area is identical to the data stored in said predetermined alternate area of said backing store.

13. The method set forth in claim 12, further including the machine-executed steps of replacing data from said front store back to said backing store whenever space in said front store is less than that required for data to be stored therein; and writing data in said alternate areas of said backing store independent of said replacement steps.

14. In a peripheral data memory system having a direct-access data storage device for retentively storing data in a plurality of record tracks, including alternate tracks to defective ones of said record tracks wherein the respective defective record tracks have retentively stored pointers to the respective alternate tracks storing data intended to be stored in the defective track, and a volatile data buffer coupled to said storage device for storing selective replications of data stored in said storage device and transferring data signals therebetween;

improvement including the machine-implemented steps of:

establishing and maintaining a directory identifying data in said data buffer from ones of said alternate tracks and preventing the transfer of said data from said data buffer to said alternate tracks such that the alternate track data is locked into said data buffer;

receiving a command from a user of said peripheral memory system indicating that the data locked into said data buffer from said alternate track can be discarded;

providing a congruence indicator, which indicates congruence or noncongruence of supposedly replicated data stored said volatile data buffer to corresponding data stored in a respective alternate record track;

if the data stored in the data buffer is indicated by said congruence indicator as being congruent to data stored in said respective alternate record track, effectively erasing the data from the data buffer and if the data stored in the data buffer is indicated as being noncongruent by said congruence indicator with respect to the data stored in the alternate track storing the data to be discarded in the respective alternate track and the effectively erasing the data replication from said data buffer;

whereby data accessed from a defective track during a predetermined access request are stored in said data buffer such that access time to alternately stored data is minimized.

15. The method set forth in claim 14, further including the machine-executed steps of:

receiving data to be written to said alternate track;

storing such data in said data buffer and immediately storing the received data in said alternate track;

receiving data to be stored in a one of said record tracks and storing said data in said data buffer;

activating a replacement algorithm for replacing data stored in the data buffer, which data is not from any of said alternate tracks, with data from predetermined ones of said record tracks whereby the data in said data buffer is continually being replaced except for the data stored with respect to said alternate track.

16. In a peripheral memory system having a retentive backing store and a volatile front store, means for selectively transferring data between said front and backing stores such that said front store contains predetermined portions of said data stored in said backing store, as well as predetermined data to be stored in said backing store as received from outside said peripheral memory system, directory means indicating data stored in said front store as it relates to said backing store and including an indication of whether or not the data in the front store is the same or different from data stored in said backing store at a location identified in said directory, a programmed processor coupled to said front and backing stores for operating same for effecting said transfers of data therebetween and having a control memory, said backing store having record tracks and alternate record tracks, any data stored in an alternate record track being identified in a record track which was intended to receive data stored in said alternate track;

the improvement, including in combination:

link list means in said control memory for identifying those data stored in said front store from said alternate record tracks, said link list including a FIFO ordering;

program indicia in said control memory and logically coupled to said link list means for replacing data in said front store with data from said backing store including means for inhibiting replacement of data from said alternate record tracks as identified in said link list means such that any data from an alternate record track moves to said front store to remain in said front store independent of said replacement program for as long as said front store has power on; and discard program means for receiving a command from a user of said peripheral memory system for discarding data from said front store and transferring data from said front store to said backing store alternate record tracks in response to said received discard command and being logically coupled to said link list means for deleting identifications of said discarded data from said link list means.

17. A hierarchical data storage system having a cache with allocatable segments of addressable storage registers, backing storage and a system controller arranged to manage data transfers of two distinguishable kinds between said backing storage and said cache and to maintain variable partitioning of the cache between data of the two kinds and replace data stored in the cache as required;

characterized in that:

said backing storage has its own backing controller which, interalia, detects defective locations on reading the same and automatically accesses a related alternative location; and said system controller being responsive to said backing controller to create or enlarge, segment by segment, a cache partition, respectively, by adding or deleting segments to and from said cache partition, upon reading a said related alternate location, exclusively for transferred units of data which have been accessed by said backing controller of an alternative location so that the other partition is the remainder of the cache which may or may not be full depending on both types of access histories and to which one replacement protocol is applied, the alternative location partition, if it exists, being independently full and for applying a different replacement protocol to replace data stored in the alternative location position.

18. A system as set forth in claim 17, in which said system controller keeps said alternative location data units in cache residence for a predetermined period of time or until power is removed from the cache, if volatile.

19. A system as set forth in claim 17 or 18, in which said system controller has an alternate location partition segment capacity indicator and comparing said segment-capacity indicator with said given value indicator and for indicating the results of the comparison and is responsive said comparator indicating that the segment capacity indication of said alternative location partition having attained said given value indicated by said given value indicator, to institute independent data replacement in said alternate location partition.

20. A system as set forth in claim 17 or 18, in which said system controller is adapted to receive external commands from a command source for being responsive to received external commands to delete data segments stored in the alternative location partition for enlarging the other partition.

21. A system as set forth in claim 17 or 18, in which replacement data is stored in said related alternative location, respectively, and a cache directory in said system controller for storing not only the corresponding backing storage location and cache addresses but also the alternative location addresses.

22. A hierarchical data storage system having a cache and backing storage with possible defective storage locations and alternate storage locations and arranged so that data that would, by reason of it associated address, be stored in a defective location is actually stored at a known related alternative location and a system controller with third means for paging portions of the data in the backing storage into the cache and having second means for managing space in the cache both for locating and casting data out from the cache to said backing storage in accordance with predetermined replacement criteria, means for indicating total cache transfer activity;

characterized in that:

means in said system controller for establishing a threshold value;

comparator means coupled to said threshold means and to said system control is arranged with first means coupled to said cache to use cast out criteria different from said predetermined replacement criteria for data accessed from an alternative location in that such data remain in the cache irrespective of cache activity for a fixed period of time or until power is removed from the cache or until the number of data items from said alternate location stored in the cache reaches a threshold value when cast out occurs independently of other data transfer and storage activity, and said second means coupled to said total cache activity indicating means for casting out said other data dependent on total cache data transfer activity.

* * * * *